United States Patent [19]

Takenaka

[11] Patent Number: 5,475,248
[45] Date of Patent: Dec. 12, 1995

[54] SEMICONDUCTOR DEVICE WITH A CONDUCTIVE REACTION-PREVENTING FILM

[75] Inventor: Kazuhiro Takenaka, Suwa, Japan

[73] Assignee: Ramtron International Corporation, Colorado Springs, Colo.

[21] Appl. No.: 303,134

[22] Filed: Sep. 8, 1994

Related U.S. Application Data

[63] Continuation of Ser. No. 166,796, Dec. 13, 1993, abandoned, which is a continuation of Ser. No. 867,238, filed as PCT/JP91/01280 Sep. 26, 1991, abandoned.

[30] Foreign Application Priority Data

Sep. 28, 1990 [JP] Japan ................. 2-259455

[51] Int. Cl.$^6$ .............. H01L 27/02; H01L 29/68
[52] U.S. Cl. .......... 257/295; 257/310; 257/532
[58] Field of Search .................. 257/295, 532, 257/310, 298

[56] References Cited

U.S. PATENT DOCUMENTS

| | | | |
|---|---|---|---|
| 4,937,650 | 6/1990 | Shinriki et al. | 257/310 |
| 5,036,382 | 6/1991 | Yamaha | 257/765 |
| 5,046,043 | 9/1991 | Miller et al. | 257/298 |
| 5,099,305 | 3/1992 | Takenaka | 257/295 |
| 5,119,154 | 6/1992 | Gnadinger | 257/295 |
| 5,122,477 | 6/1992 | Wolters et al. | 437/60 |
| 5,146,299 | 9/1992 | Lampe et al. | 257/295 |
| 5,189,503 | 2/1993 | Suguro et al. | 257/310 |
| 5,216,572 | 6/1993 | Larson et al. | 257/295 |
| 5,227,855 | 7/1993 | Momose | 257/295 |

FOREIGN PATENT DOCUMENTS

| | | | |
|---|---|---|---|
| 0448151 | 9/1991 | European Pat. Off. | 437/60 |
| 4107165 | 10/1991 | Germany | G11G 11/22 |
| 0211871 | 10/1985 | Japan . | |
| 0183570 | 7/1990 | Japan . | |
| 0186669 | 7/1990 | Japan . | |
| 0208978 | 8/1990 | Japan . | |
| 0232973 | 9/1990 | Japan . | |
| 0288367 | 11/1990 | Japan . | |

OTHER PUBLICATIONS

J. Scott, "Ferroelectric Memory Applications", IEEE 1989 Ultrasonics Symposium (Oct. 3, 1989).
C. Ting, "New Structure For Contact Metallurgy," *IBM Technical Disclosure Bulletin*, vol. 25, No. 12, pp. 6398–6399 (May, 1983).
"Use of Conducting Oxides As A Diffusion Barrier In Shallow Junction Semiconductor Devices", *IBM Technical Diclosure Bulletin*, vol. 30, No. 8, pp. 436–437 (Jan., 1988).
W. Kinney, et al., "A Non-volatile Memory Cell Based On Ferroelectric Storage Capacitors," IEEE Devices Meeting 1987 (Dec. 6, 1987).

*Primary Examiner*—Robert P. Limanek
*Assistant Examiner*—Alexander Oscar Williams
*Attorney, Agent, or Firm*—Edward D. Manzo; Mark J. Murphy; Peter J. Meza

[57] ABSTRACT

A semiconductor device comprised of a transistor (TR) having a gate electrode, a source region and a drain region, and a ferroelectric capacitor formed above a local oxide film. The capacitor has a ferroelectric film, and upper and lower electrodes that sandwich the film therebetween. The lower electrode and the source region are connected to each other through a wiring or interconnection which is formed of a conductive reaction-preventing film with an Al wiring electrode stacked thereon. The conductive reaction-preventing film is formed of TiN, MoSi, W, etc. If an annealing treatment is carried out for the purpose of improving the characteristics of the semiconductor device or a final protection film is formed after the formation of the wiring electrode, the wiring electrode and the upper electrode do not react with each other. Thus, excellent characteristics of the ferroelectric film are obtained so that a highly integrated ferroelectric memory having high performance can be formed.

15 Claims, 5 Drawing Sheets

SEMICONDUCTOR DEVICE WITH A CONDUCTIVE REACTION-PREVENTING FILM

This is a continuation of application Ser. No. 08/166,796 filed on Dec. 13, 1993 now abandoned which is a continuation of application Ser. No. 07/867,238 filed as PCT/JP91/01280, Sep. 26, 1991 now abandoned.

FIELD OF THE INVENTION

The present invention relates to a semiconductor device having a ferroelectric material, such as a ferroelectric capacitor, which can be used as a nonvolatile memory or the like.

BACKGROUND OF THE INVENTION

A nonvolatile memory using ferroelectric materials, which can reverse its polarization according to the voltage polarities applied thereto, has, in principle, the same writing and reading times. Further, at a quiescent or non-operative state (backup time) the afore-mentioned nonvolatile memory keeps polarization (residual polarization), even if no voltage is applied thereto. Therefore, it has been regarded as an ideal nonvolatile memory.

Conventionally, various semiconductor nonvolatile memories have been proposed using ferroelectric capacitors. Disclosed in U.S. Pat. No. 4,149,302 is a construction where ferroelectric capacitors are integrated on a silicon (Si) substrate. Disclosed in U.S. Pat. No. 3,832,700 is a construction having ferroelectric films disposed on the gate electrode of a MIS-type transistor.

A nonvolatile memory cell generally comprises, as shown in FIG. 8, an N-type transistor TR which has a gate electrode G connected to a word line W, a drain electrode D connected to a bit line B and a source electrode S connected to one electrode of a ferroelectric capacitor C. The other electrode of the ferroelectric capacitor C is connected to a plate line P. A recently proposed practical semiconductor construction of such a memory cell is shown in FIG. 9. The semiconductor construction shown in FIG. 9 comprises an N-type MOS transistor TR which has a polysilicon (polycrystal silicon) gate electrode 3 formed through a gate oxide film 2 on a P-type silicon substrate 1. Source and drain zones 4 and 5 are N-type high concentration diffusion regions formed in the silicon substrate 1 by using a self-aligning diffusion technique. A ferroelectric capacitor C is formed on an interlayer insulation film 7, such as phosphoric glass, etc., disposed between layers on a local oxide film (LOCOS) 6 for isolating elements. The ferroelectric capacitor C on the interlayer insulation film 7 is composed of a lower electrode 8 made of platinum (Pt), etc., a ferroelectric film 9 such as PZT, etc. and an upper electrode 10 of gold (Au) or platinum (Pt), stacked in that order. The source zone 4 which is a high concentration diffusion region and the upper electrode 10 are connected to each other with a wiring 12 made of Al through a contact hole 11. The reference number 13 indicates a second interlayer insulation film made of phosphoric glass and the like.

Gold (Au) and platinum (Pt), which form the upper electrode 10, are precious metals which do not react with the ferroelectric film and thus achieve a good interface property. Therefore, they are often used as the electrode of a ferroelectric capacitor. Also, because platinum (Pt) has a lattice constant near that of the ferroelectric material, such as PZT, the effect of improving the crystallization is expected, and as a result, platinum is used more frequently than gold.

The platinum (Pt) or gold (Au) of the upper electrode 10, however, readily reacts with the Al of the wiring electrode 12 at a temperature of around 300° C. Consequently, on carrying out an annealing process and on forming a final protection film (a passivation film) after the formation of the wiring electrode 12, a reaction of the Al of the wiring electrode with the upper electrode 10 reaches the interface of the upper electrode 10 and the ferroelectric film 9, resulting in a decrease of the residual polarization, i.e. a deterioration of the electrical properties such as a decrease of a signal charge, a decrease of the relative dielectric constant Es, etc.

In addition, as shown in FIG. 9, in the construction of the ferroelectric capacitor C formed on the interlayer insulation film 7 on the local oxide film 6, the ferroelectric capacitor C is formed by effectively utilizing a space on the local oxide film 6. The length of the wiring electrode 12 between the source zone 4 and the upper electrode 10, however, is too prolix, which results in the increase of the memory cell areas.

A memory cell structure in which, as shown in FIG. 10, the ferroelectric film 9 is directly accumulated over the source zone 4 was manufactured. In this structure, an upper electrode 14 of platinum (Pt) is formed on the ferroelectric film 9, and is connected to a plate line P (not shown) through a wiring electrode 16 of Al. Under the ferroelectric film 9, through a contact hole in an interlayer insulation film 7 of a phosphoric doped glass and the like, the lower electrode 17, made of material such as Pt, is formed. In such a structure, after the wiring electrode 16 has been formed, an annealing treatment was carried out to improve the characteristics of the ferroelectric capacitor and a final protection film (a passivation film) was formed. However a reaction of the upper electrode 14 with the wiring electrode 16 occurred. Thus, normal operation of the memory could not be expected.

For the afore-mentioned reasons, in the structures shown in FIGS. 9 and 10 have the problem that the method of improving the characteristics of the ferroelectric substance is not compatible with the formation of the final protection film.

In view of the aforesaid problems of the conventional devices, the object of the present invention is to provide a semiconductor device having a structure in which the formation of the passivation film, the annealing treatment, etc. can be achieved without impeding the function of a nonvolatile memory having a ferroelectric substance therein.

SUMMARY OF THE PRESENT INVENTION

An object of the present invention is to provide a formation or structure having a ferroelectric substance on the principal surface or on the inside of a semiconductor body or semiconductor substrate. A typical semiconductor substrate such as silicon can be used. The present invention is also applicable to semiconductor bodies which have a bonding property with oxygen such as compound semiconductors of GaAs, etc.

Regions of the structure where the ferroelectric substance is formed may be intrinsic semiconductor regions and/or N-type or P-type impurity diffusion regions or zones. Source and drain zones of a MIS-type transistor and diffusion zones for the three electrodes of a bipolar transistor are typical examples of impurity diffusion zones.

The ferroelectric substance formation can be achieved not only over an active region of an active element, but also over each of the regions of a passive element such as a diffusion resistant layer, a stopper region, etc. Of course, a ferroelectric capacitor structure can be stacked over an isolation region or the diffusion region. It is also possible to realize the structure having the ferroelectric substance in a trench.

In the present invention a conductive reaction-preventing film is disposed between an upper electrode and a wiring electrode. The conductive reaction-preventing film itself is used as the wiring electrode. In other words, the present invention has a laminated-layers structure in which a lower electrode, a ferroelectric film, an upper electrode, a conductive reactionpreventing film and a wiring electrode are sequentially stacked. For a ferroelectric substance, $PbTiO_3$, PZT, ($PbTiO_3$, $PbZrO_3$) or PLZT (La, $PbTiO_3$, $PbZrO_3$), for example, are generally used. These kinds of ferroelectric films are formed by, for example, a sputtering or sol-gel process. To improve the dielectric constant, it is necessary to carry out an oxygen annealing process. The electrodes of the ferroelectric film may be formed of, for example, Pt, Pd or Au. It is preferable to use Pt because it has a lattice constant near that of a ferroelectric substance crystal lattice constant.

The conductive reaction-preventing film may be a metal film having a high melting point such as Mo film, W film, Ti film, a metal silicide film having a high melting point such as MoSi film, TiSi film, a conductive metal nitride film such as TiN film, a conductive metal oxide film such as $RuO_2$ film, $ReO_2$ film, a conductive metal nitride oxide film such as TiON film, etc. or a compound film formed of a combination of at least two films selected from these films for example.

The structure in which the conductive reaction-preventing film is interposed between the upper electrode and the wiring electrode prevents the reaction of the upper electrode with the wiring electrode, which arises when carrying out the annealing treatment after the formation of the wiring electrode and when forming the final protection film. This structure also prevents the diffusion of a wiring electrode material (Al) into the ferroelectric film, and the deterioration of the electric characteristics such as the relative dielectric constant, the amount of polarizing electric charges, for example. As a result, a ferroelectric memory structure can be realized so that the formation of the passivation film and the annealing treatment can be carried out without impeding the function of a memory having a ferroelectric substrate therein.

In addition, according to the second embodiment of the present invention, the afore-mentioned conductive reaction-preventing film is used as a wiring electrode. Since the structure has a wiring electrode composed of A1 and another wiring electrode composed of the conductive reaction-preventing film independent from each other, it becomes possible to stack the one electrode on the plane surface of the other electrode, which allows for to the high integration of the elements.

Further, to decrease the contact resistance between a diffusion layer formed in the semiconductor body and the conductive reaction-preventing film, it is desirable to form a metal silicide film at the interface of the diffusion layer. The silicide film comprises a main ingredient of at least any one of the metals selected from the group of Pt, Ru, Re, Mo, Ta and W.

DETAILED DESCRIPTION OF THE PRESENTLY PREFERRED EMBODIMENTS

Referring to the accompanying drawings, hereinafter, the present invention will be described in detail.

Figure 1:
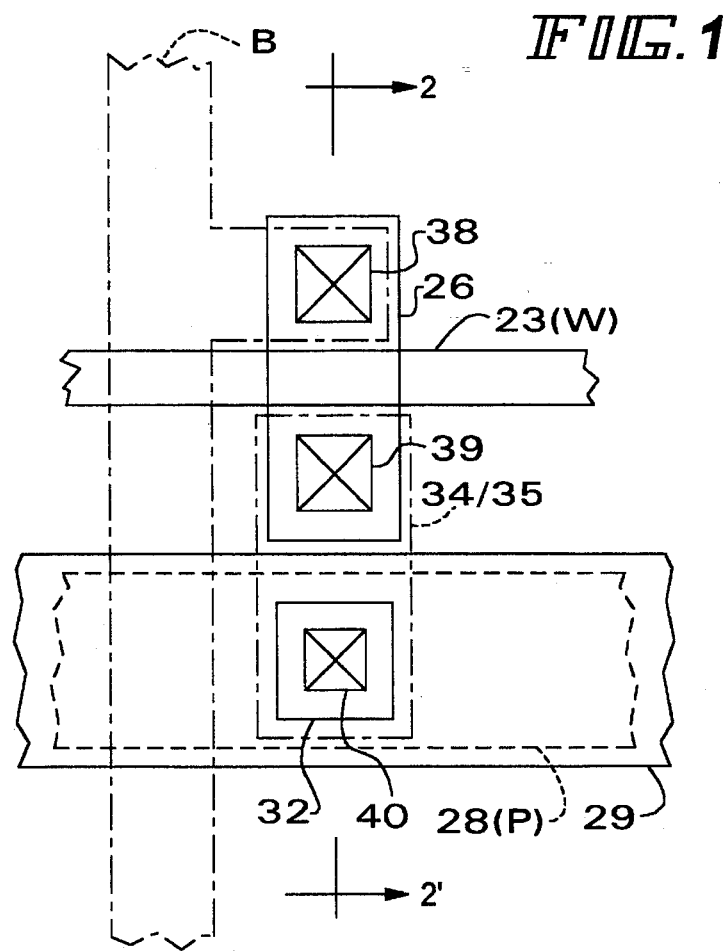
FIG. 1 is a plane view of a first embodiment of the present invention.
Figure 2:
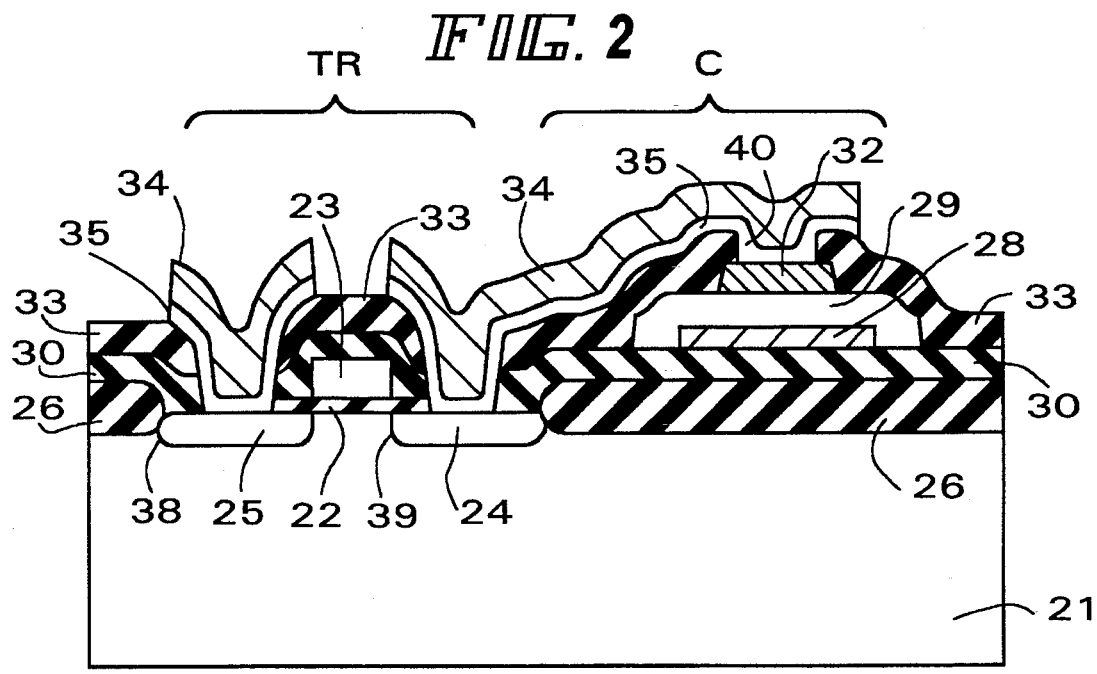
FIG. 2 is a sectional view of the FIG. 1 embodiment.

FIG. 1 is a plane view showing a semiconductor device provided with a ferroelectric capacitor relating to the first embodiment of the present invention, and FIG. 2 is a sectional view showing cross-section 2–2"of the plane view of FIG. 1.

Figure 8:
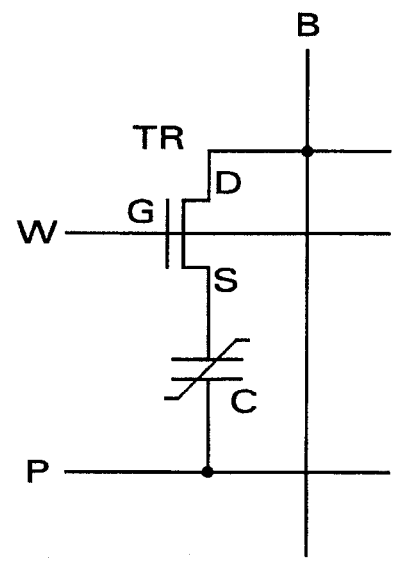
FIG. 8 is a circuit view showing a nonvolatile memory according to the present invention.
Figure 9:
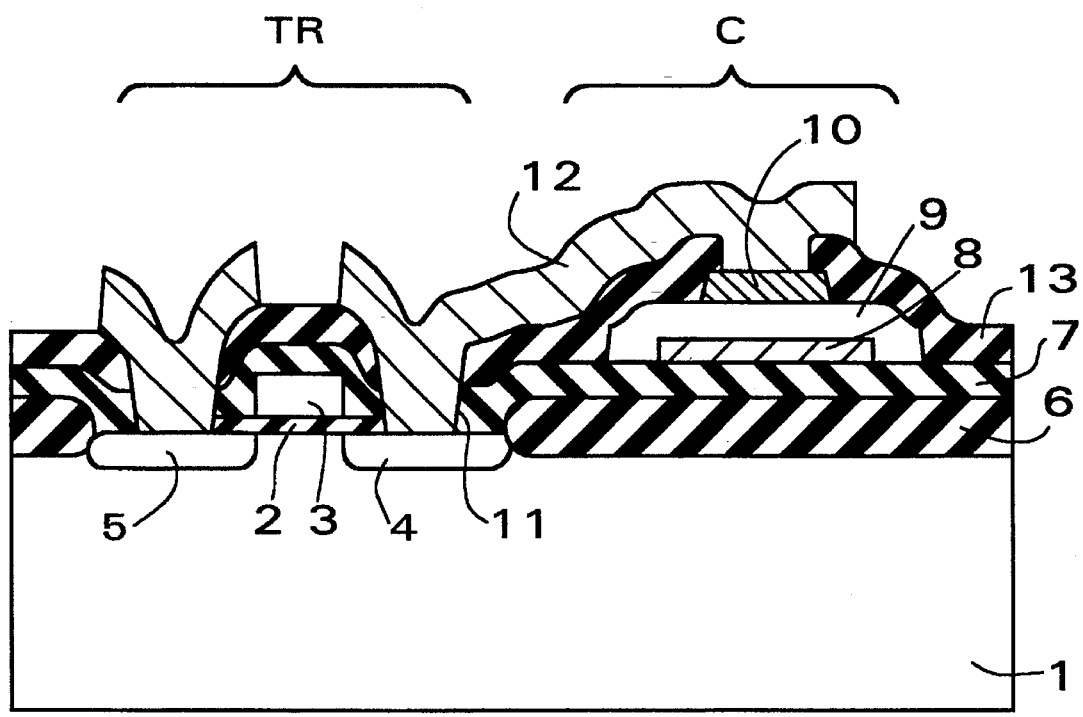
FIG. 9 is a sectional view of a semiconductor device having a ferroelectric capacitor relating to a conventional technique.
Figure 10:
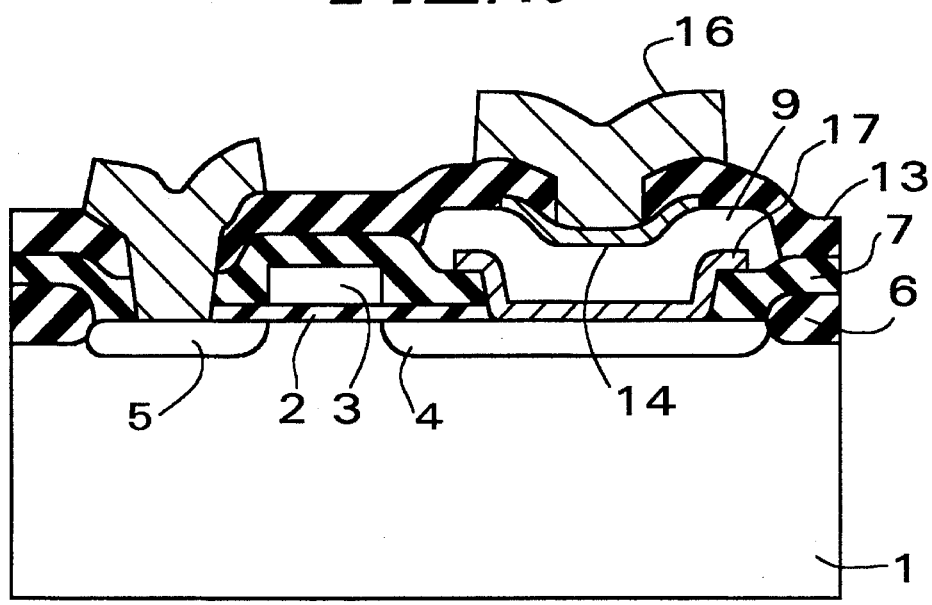
FIG. 10 is sectional view showing another example of a semiconductor device having a ferroelectric capacitor relating to a conventional technique.

A semiconductor device according to the present invention is a nonvolatile memory. Its equivalent circuit has a memory cell as shown in FIG. 8. Referring to FIG. 2, a P-type silicon substrate 21 made of a wafer having a specific resistance of, for example, 20 ohm.cm is used. On the substrate, structures of an N-type MOS transistor Tr and a ferroelectric capacitor C are formed. As is well known, a semiconductor structure of the N-type MOS transistor Tr comprises a gate electrode 23 made of phosphordoped polysilicon over a gate insulation film (silicon oxide film) 22 formed on the silicon substrate 21. Transistor Tr also has a source region 24 and a drain region 25 which are N-type diffusion regions of a high impurity concentration. The diffusion regions are formed in the substrate by an ion implantation of phosphor under a condition of 80 KV and to a concentration of $5\times10^{15}/cm^2$ while using the gate electrode 23 as a mask in a self-aligning manner.

Reference numeral 26 indicates a local oxide film (LOCOS) for isolation which has a thickness of about 600 nm. Further, numeral 30 indicates a first interlayer insulation film and, in this embodiment, the structure of the ferroelectric capacitor C is provided on the first interlayer insulation film 30. The capacitor C may be called a ferroelectric substance forming structure. This structure has a basic ferroelectric film 29, and an upper electrode 32 and a lower electrode 28 with the ferroelectric film 29 between them.

The ferroelectric film 29 is formed by using a material such as $PbTiO_3$, PZT ($PbTiO_3$, $PbZrO_3$), PLZT (La, $PbTiO_3$, $PbZrO_3$) or the like. The ferroelectric film 29 is formed to a thickness of, for example, about 500 nm by a sputtering method. The upper electrode 32 is formed, as an example, by vapor deposition or sputtering of platinum (Pt), palladium (Pd) or gold (Au) to a thickness of 300 nm. The lower electrode 28 is formed, for example, by a sputtering of platinum (Pt) or palladium (Pd) to a thickness of 300 nm.

Platinum has a lattice constant close to that of $PbTiO_3$, PZT, or PLZT and may be used for ferroelectric film 29. Therefore, when the ferroelectric film 29 is subjected to an oxygen annealing process, the platinum's crystallinity is simultaneously improved, and thus a good electric characteristic can be obtained.

A second interlayer insulating film 33 can be made of phosphoric glass having a thickness of about 400 nm and can be formed by a CVD technique. The connection between the upper electrode 32 and the source region 24 is attained by a oxygen-diffusion preventing film 31 interposed between an interconnection or wiring formed by a conductive reaction-preventing film 35 and a wiring electrode 34. The conductive reaction-preventing film 35 comprises TiN, for example and is formed by sputtering to a thickness of about 100 nm. The wiring electrode 34 comprises Al, for example and is formed by sputtering or vapor deposition to a thickness of about 1000 nm. To the drain region 25 is connected, through a contact hole, a stacked layer of a conductive reaction-preventing film 35 and an Al wiring electrode 34, like that of the source region.

A method for forming a semiconductor device, including such a ferroelectric capacitor, comprises the step of coating platinum (Pt) over the surface of the semiconductor body by using a sputtering process, after forming the first interlayer insulation film 30 which covers the surface of the semiconductor body. Then, a predetermined pattern of the first interlayer insulation film 30 is formed by a conventional photolithography technique, then a pattern of the lower electrode 28 is formed by using, for example, a conventional ion milling technique.

The coating of PZT is carried out by using a sputtering method or sol-gel method to form the ferroelectric film 29, and a predetermined pattern is formed by using a conventional photolithography technique. For example, the ferroelectric film is etched by using a conventional ion milling technique to form a pattern of the ferroelectric film 29. Next, after coating platinum (Pt) over the surface of the semiconductor body by using a sputtering method, a predetermined pattern is formed by using a conventional photolithography technique. For example, the platinum is etched by using a conventional ion milling technique to form a pattern of the upper electrode 32. An annealing treatment in an oxygen-including atmosphere can be carried out for the ferroelectric film 29 during the formation of the capacitor to improve the crystallization.

After forming the capacitor, the second interlayer insulation film 33 is formed. Contact holes 38, 39 and 40 to the drain region, the source region and the upper electrode are the formed. Next, the conductive reaction-preventing film 35 and the wiring electrode 34 are sequentially laminated or stacked on the second interlayer insulation layer 33 formed by using photolithography and etching techniques. To form a conductive reaction-preventing film 35 of a TiN film, there are available many methods, such as a sputter method using a TiN target, a reactive sputter method using a Ti target in a nitrogen-including atmosphere, or a method of forming the TiN film by sputtering the Ti and annealing it in an nitrogen-including atmosphere.

As described above, the conductive reaction-preventing film 35 is formed as one of the layers under the wiring electrode 34. Therefore, an annealing treatment at a temperature of around 500° C. becomes possible even after forming the wiring electrode 34. In addition, a vapor phase growth at a temperature of about 400° C. is generally used for forming a final protection film of $SiO_2$, SiN, for example, after forming the wiring electrode 34, and for forming an interlayer insulation film, such as a $SiO_2$ film, in the case of a two-layer wiring electrode structure. Because the conductive reaction-preventing film 35 exists between the wiring electrode 34 and the upper electrode 32, the upper phase growth can be affected without any deterioration of the properties or characteristics.

In fact, for a conventional structure where the Al wiring electrode and the Pt upper electrode are directly contacting each other, the characteristics deteriorated remarkably. The residual polarization of 10 micro.coulomb and the relative dielectric constant of 1000 before forming the final protection film changed to a residual polarization of 2 micro.coulomb and a relative dielectric constant of 250 after forming the $SiO_2$ protection film. However, when providing a conductive reaction-preventing film like that mentioned in the above example, it was ascertained that a ferroelectric memory structure is obtained such that there is no deterioration of the residual polarization (9.8 micro.coulombs) and of the relative dielectric constant (1000). Additionally, plasma SiN, for example, which had been used heretofore in the semiconductor IC as the final protection film, can be formed, It was ascertained that the reliability over a long span of time concerning resistance to the humidity, etc. could be improved.

Because it becomes possible to obtain a structure having two or more layers, the freedom of wiring arrangements is greatly increased, and it becomes possible to make an IC having more, higher functions. The advantage of making the wiring structure of two or more layers leads not only to the increase in the freedom of wiring arrangements, but also to the stability of the ferroelectric memory operation. That is, in FIG. 1, a plate line P is formed of the lower electrode 28. Using Pt to form the lower electrode 28, which has a sheet resistance of a magnitude greater than that of Al, imposes a resistance on the plate line, which causes signal delay and instability of the electric potential at the plate line. When using a two-layer wiring where the first wiring layer is used to connect the source region 24 to the upper electrode 32 (see FIG. 2) and the second wiring layer is provided in parallel with the plate line and is connected to the plate line, the wiring resistance of the plate line becomes substantially equivalent to the resistance of the second wiring layer, namely the resistance of Al. Therefore, it becomes possible to make the resistance of the plate line lower and, as a result, stability of the electric potential of the plate line can be obtained.

Furthermore, because the conductive reaction-preventing film 35 is formed on the connection areas between the source region and the film, and between the drain and the film, reaction with Al in the wiring electrode 34 or with Si in the drain or source region is prevented. It is also effective against the increase of a junction leakage current due to the reaction with Al and Si, and the increase of the contact resistance caused by the deposition or separation of Si in the contact hole.

Figure 3:
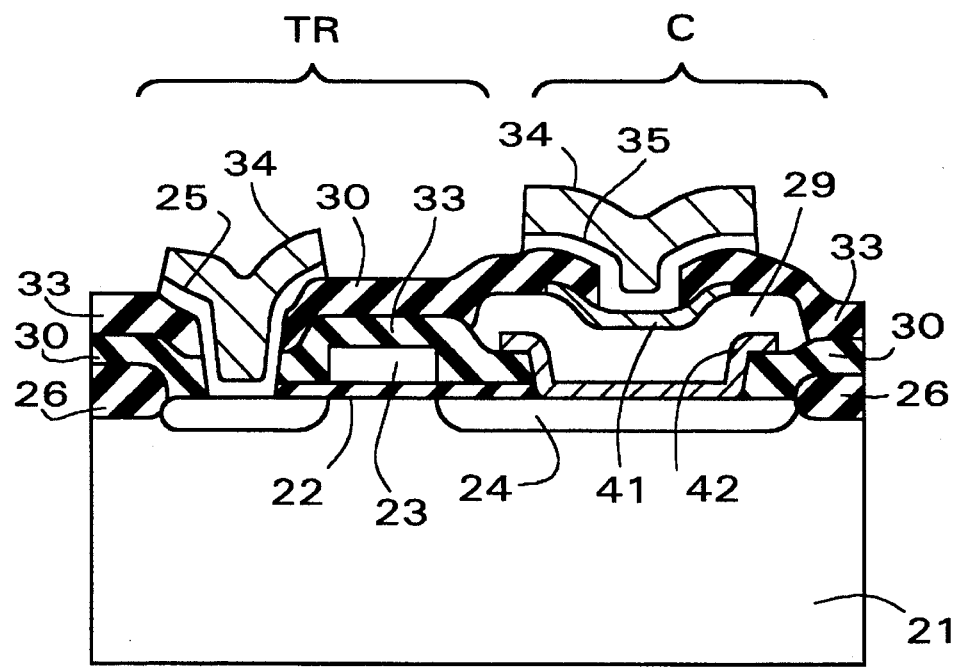
FIG. 3 is a sectional view of a deformed example of the FIG. 1 embodiment.

FIG. 3 is the sectional view showing a variation of the semiconductor device according to the first embodiment. Note that in FIG. 3 the same reference numerals and characters are given to each of the same parts shown in FIG. 1, and the explanation for each of them will be omitted. In the previously explained variation of the first embodiment, the capacitor has been formed on the local oxidization film 26, but in this variation, the ferroelectric capacitor is laminated on the source region 24 in a stacked manner. Accordingly, an occupied area of the wiring between the source region 24 and the lower electrode 42 can be effectively saved, so that a reduction of the area of a cell has been successfully realized.

In addition, the conductive reaction-preventing film 35 is formed between the upper electrode 41 and the wiring electrode 34, so that, like the above-mentioned variation of the first embodiment, the reaction of the upper electrode 41 with the wiring electrode 34 is prevented. Accordingly, it becomes possible to carry out the annealing treatment, after forming the wiring electrode 34, and to form the interlayer and final protection films.

As can be clearly understood by comparing FIGS. 2 and 3, the upper electrode 32 in FIG. 2 corresponds topologically to the lower electrode 42 of FIG. 3. It is also possible to form the upper electrode 41 to serve as the plate line P and its wiring of aluminum because the plate line P is able to be formed over the ferroelectric film 29. For this reason, fluctuation of the plate voltage in each of the cells is improved remarkably in comparison with the conventional cells. Further, in a conventional art, when a ferroelectric capacitor C is stacked vertically over a LOCOS film there arises a problem with step coverage. However, in the present embodiment, since the ferroelectric capacitor is formed at either side of the gate electrode 23, the step coverage can be improved.

Figure 4:
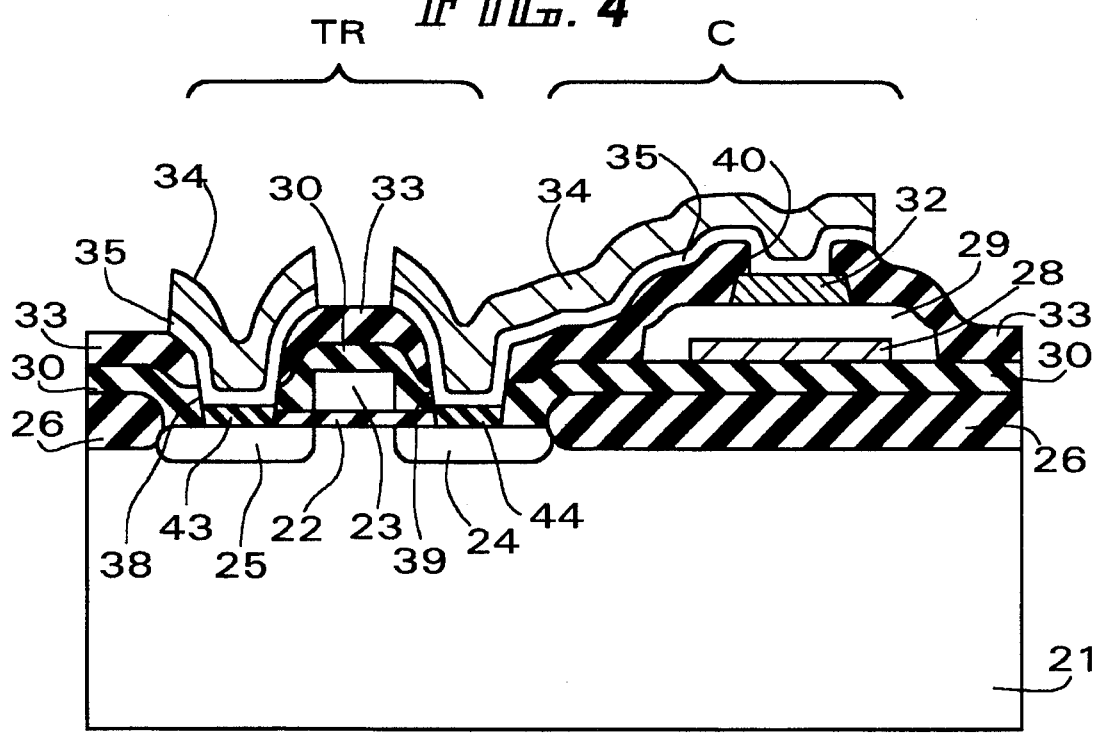
FIG. 4 is a sectional view of a second embodiment of the present invention.

FIG. 4 is a sectional view showing a principal part of a semiconductor device provided with a ferroelectric capacitor according to the second embodiment of the present invention. Similar to FIG. 2, in this embodiment the ferroelectric capacitor C is formed over the local oxide film 26 for isolation. In this embodiment, in addition to the structure as explained in the first embodiment, there are provided metal silicides 44 and 43 at the contact between the conductive reaction-preventing film 35 and the source region 24, and at the contact between the film and the drain region 25, respectively. The metal silicides are formed of silicide films having as a main component one of the metals selected from a group of Ti, Pt, Ru, Re, Mo, Ta and W. The metal silicide decreases the contact resistance between the conductive reaction-preventing film 35 and the source and drain regions 24 and 25, respectively.

The following methods for forming a metal silicide are used. For Ti silicide, the method includes the steps of forming the opening 40 for the upper electrode, the opening 39 for the source region, and the opening 38 for the drain region. Then, Ti is coated over the whole surface of the structure, and an annealing treatment is carried out in an oxygen-including atmosphere to form Ti silicides 43 and 44 at the titanium portions contacting the Si and the TiN conductive reaction-preventing film 35. Another method includes the steps of forming only Ti silicide by using an annealing treatment, etching only the unreacted Ti by using a mixture liquid of ammonia, acetic acid and water to thereby leave only Ti silicide at the source region 44 and the drain region 43.

The second embodiment is also applicable to the case where the ferroelectric capacitor C is formed above the source region in a stacked manner, as shown in FIG. 3.

Figure 5:
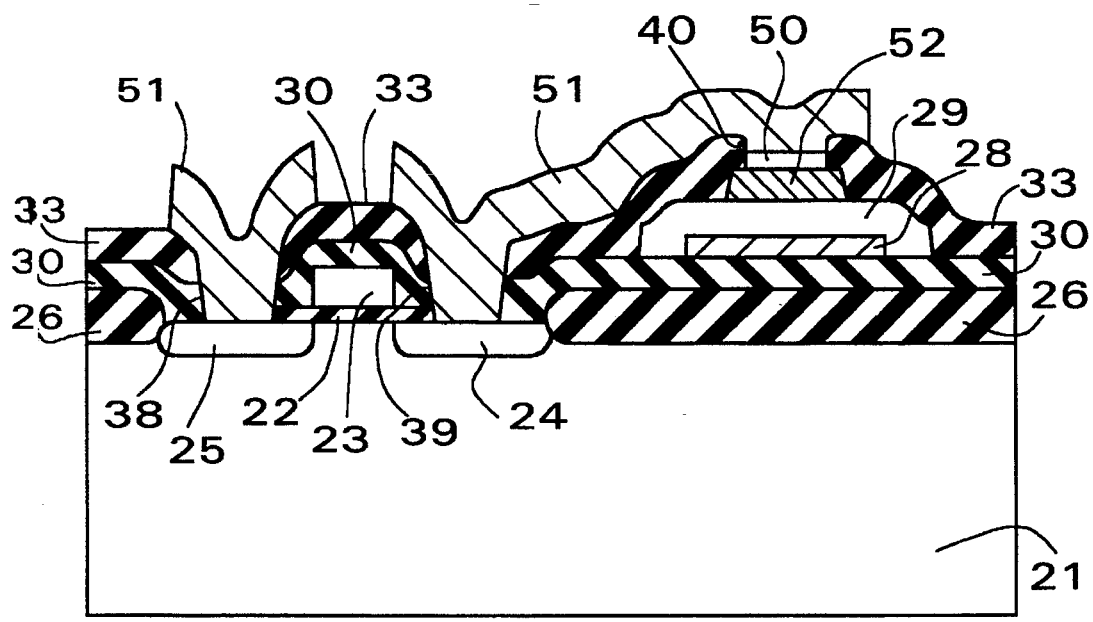
FIG. 5 is a sectional view of a third embodiment of the present invention

FIG. 5 is a sectional view showing a semiconductor device having a ferroelectric capacitor relating to a third embodiment. In this embodiment, a ferroelectric capacitor C is formed on a local oxide film 26 for isolation. A conductive reaction-preventing film 50 is stacked on an upper electrode 52. The conductive reaction-preventing film 50 and the upper electrode 52 are formed upon etching the upper electrode 52. Since the Al serving as a wiring electrode 51 contacts with the conductive reaction-preventing preventing film 50 stacked on the upper electrode 52, the reaction of Al with Pt is inhibited, as in the first and second embodiments. Further, since the wiring electrode 51 is formed of Al, as in the conventional art, there is no special metallic silicide at the contact portions of the Si with the wiring electrode 51, thereby making a short process. Of course, as is the case of the second embodiment, a metal silicide may be formed to lower the contact resistance. In addition, the third embodiment is also applicable to a case where the ferroelectric capacitor C, as shown in FIG. 3 is formed on the source region in the stacked manner.

Figure 6:
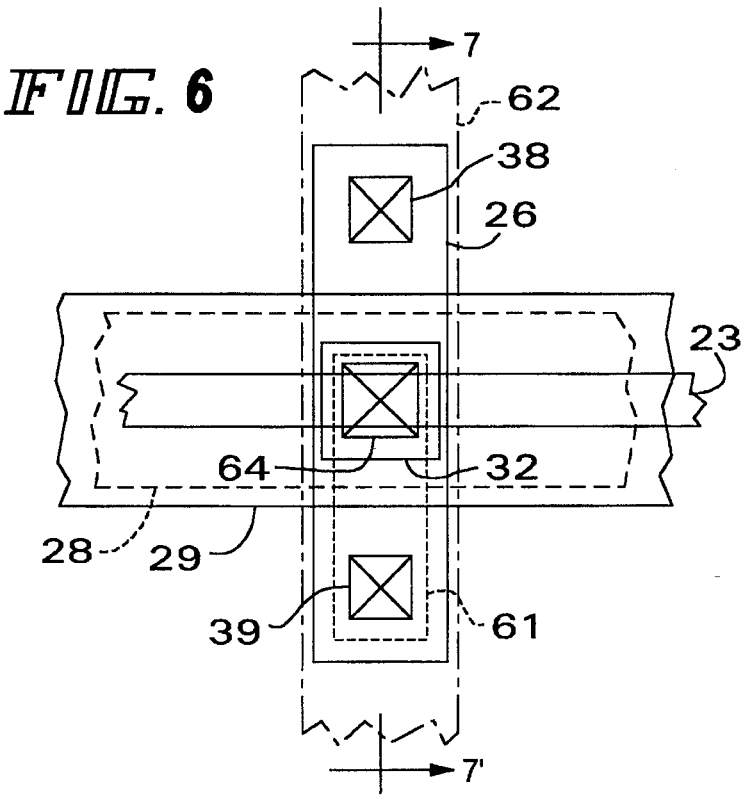
FIG. 6 is a plane view of a fourth embodiment of the present invention.
Figure 7:
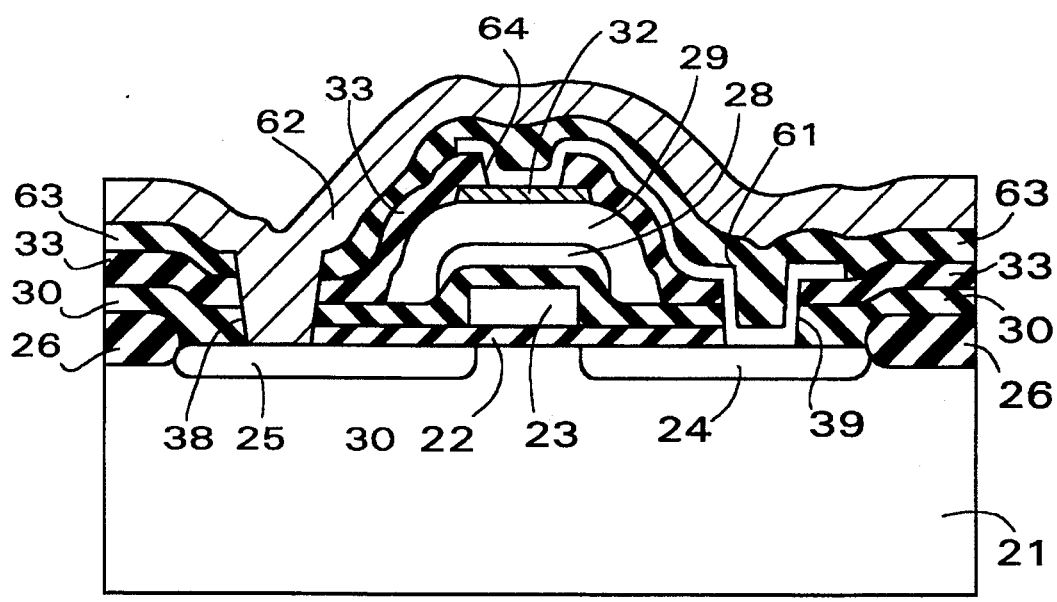
FIG. 7 is a sectional view of the fourth embodiment of the present in invention.

FIG. 6 is a plan view illustrating a semiconductor device having a ferroelectric capacitor according to a fourth embodiment of the present invention, and FIG. 7 is a sectional view taken along line 7–7' of FIG. 6. Referring to FIG. 7, in this embodiment a ferroelectric capacitor C is formed above a gate electrode 23, and an upper electrode 32 is connected to a source region 24 through a conductive reaction-preventing film 61. The conductive reaction-preventing film 61 comprises TiN and is formed by a sputtering method to a thickness of 150 nm. A wiring formed of the conductive reaction-preventing film 61 is separated from an Al wiring electrode 62 by a third interlayer insulation film 63, thereby arranging the Al wiring electrode 62 at a position above the ferroelectric capacitor C as shown in FIG. 6, which results in a substantial reduction of the occupied area. The upper electrode 32 and a source diffusion layer 24 are connected to each other through the conductive reaction-preventing film 61, and the Al wiring electrode 62 is only used as a bit line. Therefore, the occupied area is reduced to about one-half and the integration density is increased about two fold as compared to the first embodiment shown in the plane view of FIG. 1.

The connection between the upper electrode 32 and the source diffusion layer 24 with the use of the conductive reaction-preventing film 61 provides other advantages besides the reduction of the occupied area. For example, since the conductive reaction-preventing film 61 is stable up to a temperature of around 800° C., even if the ferroelectric capacitor C deteriorates during the formation of a contact hole 64 to the upper electrode or a conductive reaction-preventing film 61, the deterioration can be completely recovered by carrying out a post-annealing treatment at a temperature of 800° C. In addition, the conductive reaction-preventing film 61 is completely separated from the Al wiring electrode 62 by the interlayer insulation film 63. The contact portions where the Al wiring electrode 62 is formed have a depth equal to each other in spite of the places where the holes are formed. Therefore, on performing the contact hole etching treatment, equal depth etching is carried out. Thus, there are advantages in that the etching treatment becomes easier, and the Al wiring electrode has an excellent step coverage. On the contrary, in the structure shown in FIG. 2, the upper electrode portion, and the source and drain regions are different in the thickness to be etched, which interferes with the detecting of an etching end point. Furthermore, in this embodiment, Al, such as used in the conventional art, is also used to form the wiring electrode like that of the third embodiment to thereby cause an effect of the short process. The above-mentioned metal silicide may be formed, of course, at interfaces between the wiring electrode 62 and the drain region 25, and between the conductive reaction-preventing film 61 and the source region 24, respectively, to reduce their contact resistances.

With respect to the afore-mentioned ferroelectric formations on a diffusion region or the substrate, the descriptions have been given mainly regarding nonvolatile memories. In addition, they can be applied to other types of memories (DRAMs) which utilize a large relative dielectric constant of a ferroelectric substance and to a circuit network which requires high capacitance.

The descriptions have been given regarding the ferroelectric film as a material to construct a capacitor. Of course, it is also possible to apply the present invention to memories constructed using $SrTiO_3$ which has a large relative dielectric constant and oxide films having a ferroelectric constant such as $Ta_2O_5$, for these materials require platinum (Pt), for example as an electrode.

In addition, in the embodiments of the present invention, the ferroelectric substance and the electrodes are formed in a stacked manner, but the electrode and the ferroelectric film may be laterally arranged with each other and a connection of the electrodes may be formed by using the conductive reaction-preventing film.

Furthermore, although the above descriptions relate to the present invention being applied to a memory as an application example of the afore-mentioned ferroelectric substance, the present invention can also be applied to an element utilizing a pyroelectric or a piezoelectric effect of the ferroelectric substance, for example a pyroelectric sensor, piezoelectric element, piezoelectric sensor, etc.

As described above, the semiconductor device having a ferroelectric substance according to the present invention provides a ferroelectric substance at the main surface of a silicon substrate, etc. or on the inside thereof. A ferroelectric substance free from a reduction in characteristics can be formed, even if an electrode of the ferroelectric substance reacts strongly with a wiring electrode. A zone or region where a structure having the ferroelectric substance can be formed may be an intrinsic semiconductor, or an N- or P-type impurity diffusion region. According to the present invention, the ferroelectric formative construction can be realized not only on an active zone or a region of an active element, but also on each of the zones or regions of passive elements, such as a resistant diffusion layer, a stopper region, etc. Typical examples are a source or drain region of a MIS-type transistor, impurity diffusion regions of the three electrodes of a bipolar transistor, etc. It is, of course, possible to realize a ferroelectric capacitor construction over a diffusion region in a stacked manner and even in a trench. The semiconductor device according to the present invention is quite suitable for a nonvolatile memory of which a high integration is required.

I claim:

1. A semiconductor device comprising:

a transistor having a gate electrode and source and drain regions;

an oxide layer located adjacent to said transistor;

a capacitor having lower and upper platinum electrodes and a dielectric, comprised of a ferroelectric material, disposed between said electrodes, said capacitor being completely located directly above said oxide layer;

a conductive, reaction-preventing film disposed over said upper platinum electrode and comprising a separate layer from said platinum electrodes and comprised of a different material than said platinum electrodes; and an aluminum wiring electrode disposed over said conductive, reaction-preventing film and comprised of a different material than said conductive, reaction-preventing film;

wherein said conductive, reaction-preventing film is located between said upper platinum electrode and said aluminum wiring electrode to prevent a reaction between said upper platinum electrode and said aluminum wiring electrode that would adversely affect the ferroelectric material and wherein said conductive, reaction-preventing film and said aluminum wiring electrode extend from said upper electrode to said source region.

2. A device according to claim 1 wherein said conductive, reaction-preventing film is a film selected from the group comprising a metal film having a high melting point, a metal silicide film having a high melting point, a conductive metal nitride film, a conductive metal oxide film and a conductive metal nitride oxide film.

3. A device according to claim 1 wherein said conductive, reaction-preventing film electrical couples said upper electrode to said source region.

4. A device according to claim 3 wherein a further portion of said conductive, reaction-preventing film is disposed over said drain region.

5. A device according to claim 4 further comprising a metal silicide disposed between said conductive, reaction-preventing film and at least one of said source and drain regions and directly contacting said conductive, reaction-preventing film and said one of said source and drain regions.

6. A device according to claim 5 wherein said metal silicide is a metal selected from the group comprising Ti, Pt, Ru, Re, Mo, Ta and W.

7. The device of claim 1 wherein said ferroelectric material comprises a material selected from the group comprising $PbTiO_3$, PZT and PLZT.

8. The device of claim 2 wherein said metal film comprises a film selected from the group comprising Mo, W, Ti, MoSi, TiSi, TiN, $TuO_2$, $ReO_2$ and TiON.

9. The device of claim 4 wherein said aluminum wiring electrode is disposed over said conductive, reaction-preventing film which is disposed over said other of said source and drain regions.

10. A semiconductor device comprising:

a transistor having a gate electrode and source and drain regions, said gate electrode being located between said source and drain regions;

an oxide layer located adjacent to said transistor;

a capacitor having lower and upper platinum electrodes and a dielectric, comprised of a ferroelectric material, disposed between said electrodes, said capacitor being located directly over said oxide layer;

a conductive, reaction-preventing film disposed over said upper platinum electrode and comprising a separate layer from said platinum electrodes and comprised of a different material than said platinum electrodes; and an aluminum wiring electrode disposed over said conductive, reaction-preventing film and comprised of a different material than said conductive, reaction-preventing film;

wherein said conductive, reaction-preventing film is located between said upper platinum electrode and said aluminum wiring electrode to prevent a reaction between said upper platinum electrode and said aluminum wiring electrode that would adversely affect the ferroelectric material and wherein said wiring electrode extends from said conductive, reaction-preventing film over said upper electrode to said source region.

11. A device according to claim 10 wherein a further portion of said conductive, reaction-preventing film is disposed over said drain region.

12. A device according to claim 11 further comprising a metal silicide disposed between said conductive, reaction-preventing film and at least one of said source and drain regions.

13. A device according to claim 12 wherein said metal silicide is a metal selected from the group comprising Ti, Pt, Ru, Re, Mo, Ta and W.

14. The device of claim 1 further comprising a first interlayer insulation film located directly above said oxide layer, wherein said capacitor is located directly above said first interlayer insulation film.

15. The device of claim 10 further comprising a first interlayer insulation film having a portion located directly above said oxide layer, wherein said capacitor is located directly over said portion of said first interlayer insulation film.

* * * * *